(12) United States Patent
Soma

(10) Patent No.: US 12,720,690 B2
(45) Date of Patent: Aug. 25, 2026

(54) THREE-PHASE POWER SUPPLY SWITCHING UNIT

(71) Applicant: SEIKO EPSON CORPORATION, Tokyo (JP)

(72) Inventor: Yukinori Soma, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 202 days.

(21) Appl. No.: 18/783,644

(22) Filed: Jul. 25, 2024

(65) Prior Publication Data

US 2025/0040068 A1 Jan. 30, 2025

(30) Foreign Application Priority Data

Jul. 28, 2023 (JP) ................................ 2023-123200

(51) Int. Cl.
*H05K 5/02* (2006.01)
*H05K 1/181* (2026.01)
*H02M 5/293* (2006.01)

(52) U.S. Cl.
CPC ........... *H05K 5/0217* (2013.01); *H05K 1/181* (2013.01); *H05K 5/0252* (2013.01); *H02M 5/293* (2013.01)

(58) Field of Classification Search
CPC .... H05K 5/0217; H05K 1/181; H05K 5/0252; H02M 5/293
See application file for complete search history.

(56) References Cited

U.S. PATENT DOCUMENTS

2011/0080693 A1* 4/2011 Tsai ........................ G06F 1/189 361/627
2022/0311425 A1 9/2022 Hikichi
2022/0416709 A1* 12/2022 Takahashi ............ H02P 25/188

FOREIGN PATENT DOCUMENTS

JP 2022-146999 A 10/2022

* cited by examiner

*Primary Examiner* — Rafael O De Leon Domenech
(74) *Attorney, Agent, or Firm* — Harness, Dickey & Pierce, P.L.C.

(57) ABSTRACT

The three-phase power supply switching unit includes an electrical board on which either a first wiring unit or a second wiring unit is mounted, wherein the electrical board has an input section and an output section, a first wiring unit has a first input connection section, a first output connection section, and a first wiring that, when the first wiring unit is mounted on the electrical board, connects the first input connection section and the first output connection section so that Y-connection three-phase AC that was input to the input section is output as single-phase AC from the output section, and a second wiring unit has a second input connection section, a second output connection section, and a second wiring that, when the second wiring unit is mounted on the electrical board, connects the second input connection section and the second output connection section so that delta connection three-phase AC that was input to the input section is output as single-phase AC from the output section.

8 Claims, 9 Drawing Sheets

THREE-PHASE POWER SUPPLY SWITCHING UNIT

The present application is based on, and claims priority from JP Application Serial Number 2023-123200, filed Jul. 28, 2023, the disclosure of which is hereby incorporated by reference herein in its entirety.

BACKGROUND

1. Technical Field

The present disclosure relates to a three-phase power supply switching unit.

2. Related Art

For example, JP-A-2022-146999 discloses a semiconductor device with a switch circuit that can switch a connection state of an input terminal pair and an output terminal pair between two wiring states according to a logic level that was input to control terminals.

In a unit for converting three-phase alternating current of Y-connection or delta connection into single-phase alternating current, when a state in which Y-connection three-phase alternating current is converted into single-phase alternating current and a state in which delta connection three-phase alternating current is converted into single-phase alternating current are switched by signal control, there has been a problem that circuits become complicated.

SUMMARY

According to a first aspect of the present disclosure, a three-phase power supply switching unit is provided. This three-phase power supply switching unit includes an electrical board on which either a first wiring unit or a second wiring unit is mounted, wherein the electrical board has an input section to which Y-connection three-phase alternating current or delta connection three-phase alternating current is input, and an output section that outputs single-phase alternating current, the first wiring unit has a first input connection section that is connected to the input section, a first output connection section that is connected to the output section, and a first wiring that connects the first input connection section and the first output connection section so that Y-connection three-phase alternating current that was input to the input section is output as single-phase alternating current from the output section when the first wiring unit is mounted on the electrical board, the second wiring unit has a second input connection section that is connected to the input section, a second output connection section that is connected to the output section, and a second wiring that connects the second input connection section and the second output connection section so that delta connection three-phase alternating current that was input to the input section is output as single-phase alternating current from the output section when the second wiring unit is mounted on the electrical board.

DESCRIPTION OF EMBODIMENTS

A. First Embodiment

Figure 1:
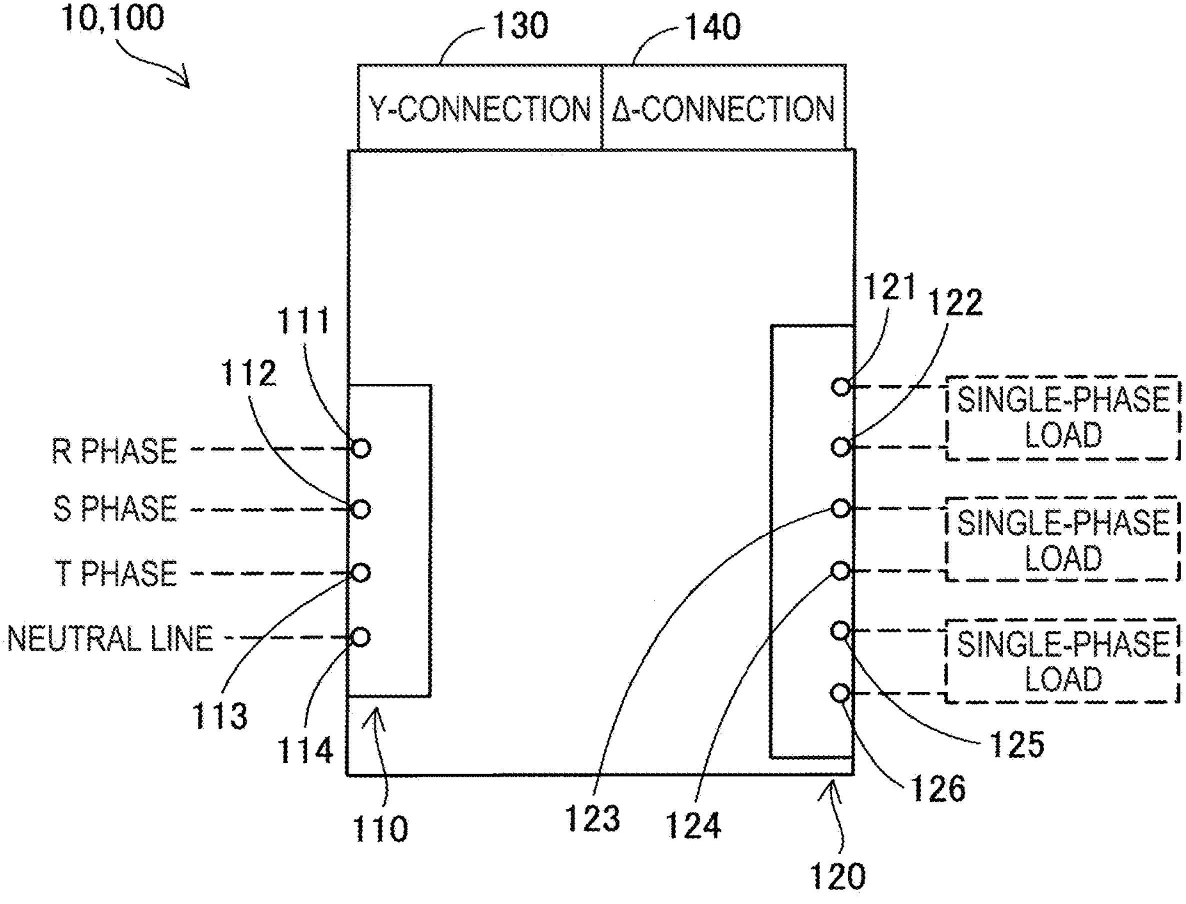
FIG. 1 is an explanatory diagram showing a schematic configuration of a three-phase power supply switching unit.

FIG. 1 is an explanatory diagram showing a schematic configuration of a three-phase power supply switching unit 10. The three-phase power supply switching unit 10 converts Y-connection three-phase alternating current (AC) or delta connection three-phase alternating current (AC) to single-phase alternating current. The three-phase power supply switching unit 10 is installed, for example, in a factory. Y-connection three-phase AC or delta connection three-phase AC is supplied to the three-phase power supply switching unit 10 from a power distribution board installed in a factory. The three-phase power supply switching unit 10 converts three-phase AC supplied from the power distribution board into single-phase AC, and supplies it to devices installed in a factory. The three-phase power supply switching unit 10 has an electrical board 100. Either a first wiring unit 200 or a second wiring unit 300 is mounted on the electrical board 100.

The electrical board 100 has an input section 110, an output section 120, a Y-connection display section 130, and a delta connection display section 140.

Y-connection three-phase AC or delta connection three-phase AC is input to the input section 110. The voltage of three-phase AC input to the input section 110 is about 200 V to 400 V. The input section 110 has a first input terminal 111, a second input terminal 112, a third input terminal 113, and a fourth input terminal 114. Each phase of three-phase AC is input to the first input terminal 111, the second input terminal 112, and the third input terminal 113. For example, R phase is input to the first input terminal 111, S phase is input to the second input terminal 112, and T phase is input to the third input terminal 113. When the Y-connection three-phase AC is input to the input section 110, a neutral line is connected to the fourth input terminal 114. When the delta connection three-phase AC is input to the input section 110, nothing is connected to the fourth input terminal 114. In the following, when each input terminal is referred to without distinction, it is simply referred to as an input terminal. In this embodiment, the input terminals are a female type terminal.

The output section 120 outputs single-phase AC. The output section 120 has a first output terminal 121, a second output terminal 122, a third output terminal 123, a fourth output terminal 124, a fifth output terminal 125, and a sixth output terminal 126. In this embodiment, the output section 120 outputs three sets of single-phase AC. The output section 120 outputs one set of single-phase AC from each of the first output terminal 121 and the second output terminal 122, the third output terminal 123 and the fourth output terminal 124, and the fifth output terminal 125 and the sixth output terminal 126. The voltage of the single-phase AC output from the output section 120 is about 200 V to 240 V. Hereinafter, when each output terminal is referred to without distinction, it is simply referred to as an output terminal. As shown in FIG. 1, a single-phase load is connected to each output terminal. The single-phase load is, for example, a device installed in a factory where the three-phase power supply switching unit 10 is mounted. In this embodiment, the output terminals are female type terminals.

The Y-connection display section 130 is indicating that it is Y-connection. The delta connection display section 140 is indicating that it is delta connection. The Y-connection display section 130 and the delta connection display section 140 are located in an upper portion of the electrical board 100. The Y-connection display section 130 indicates "Y-connection", and the delta connection display section 140 indicates "A connection."

Figure 2:
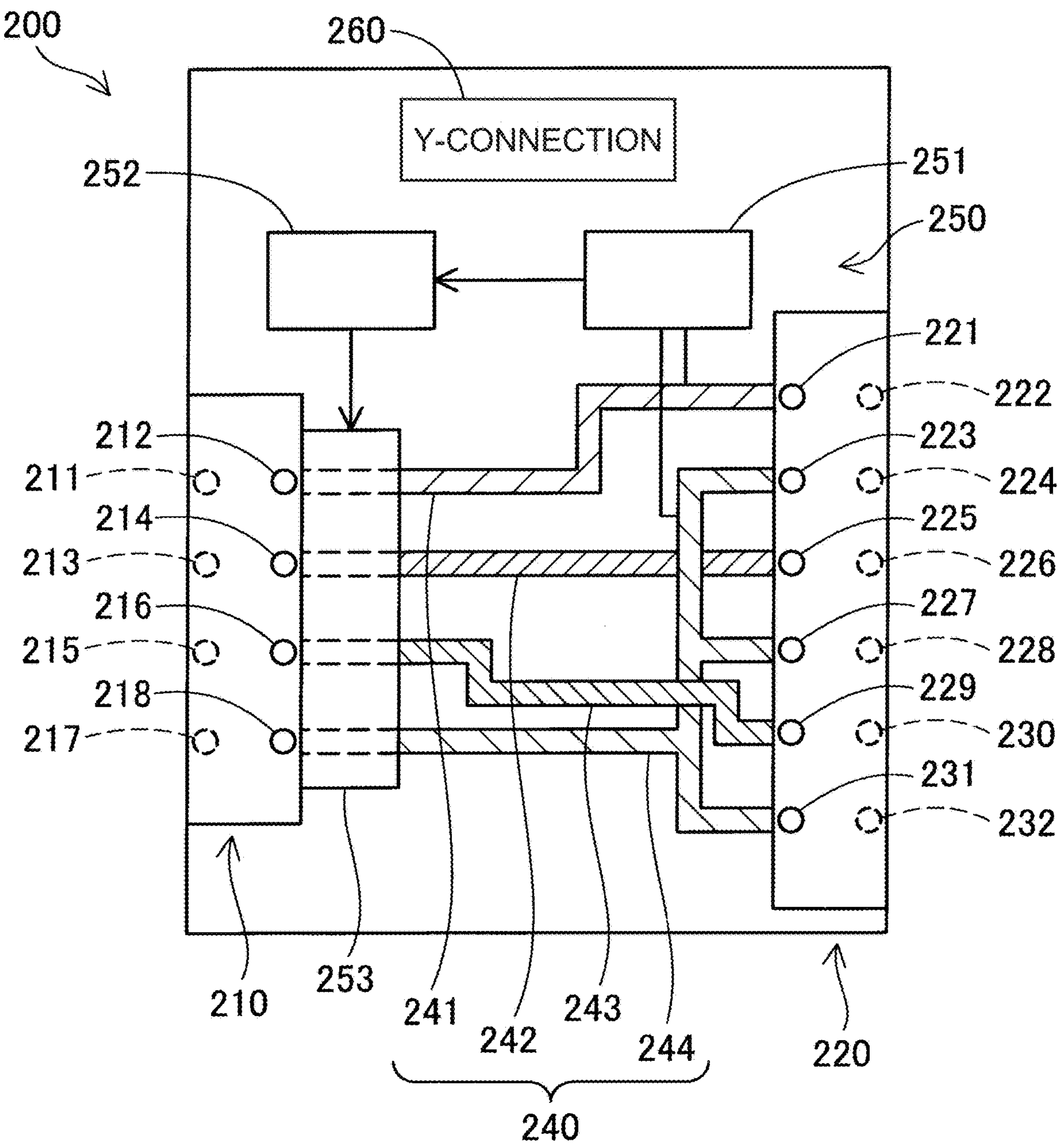
FIG. 2 is a diagram showing an internal configuration of a first wiring unit.
Figure 3:
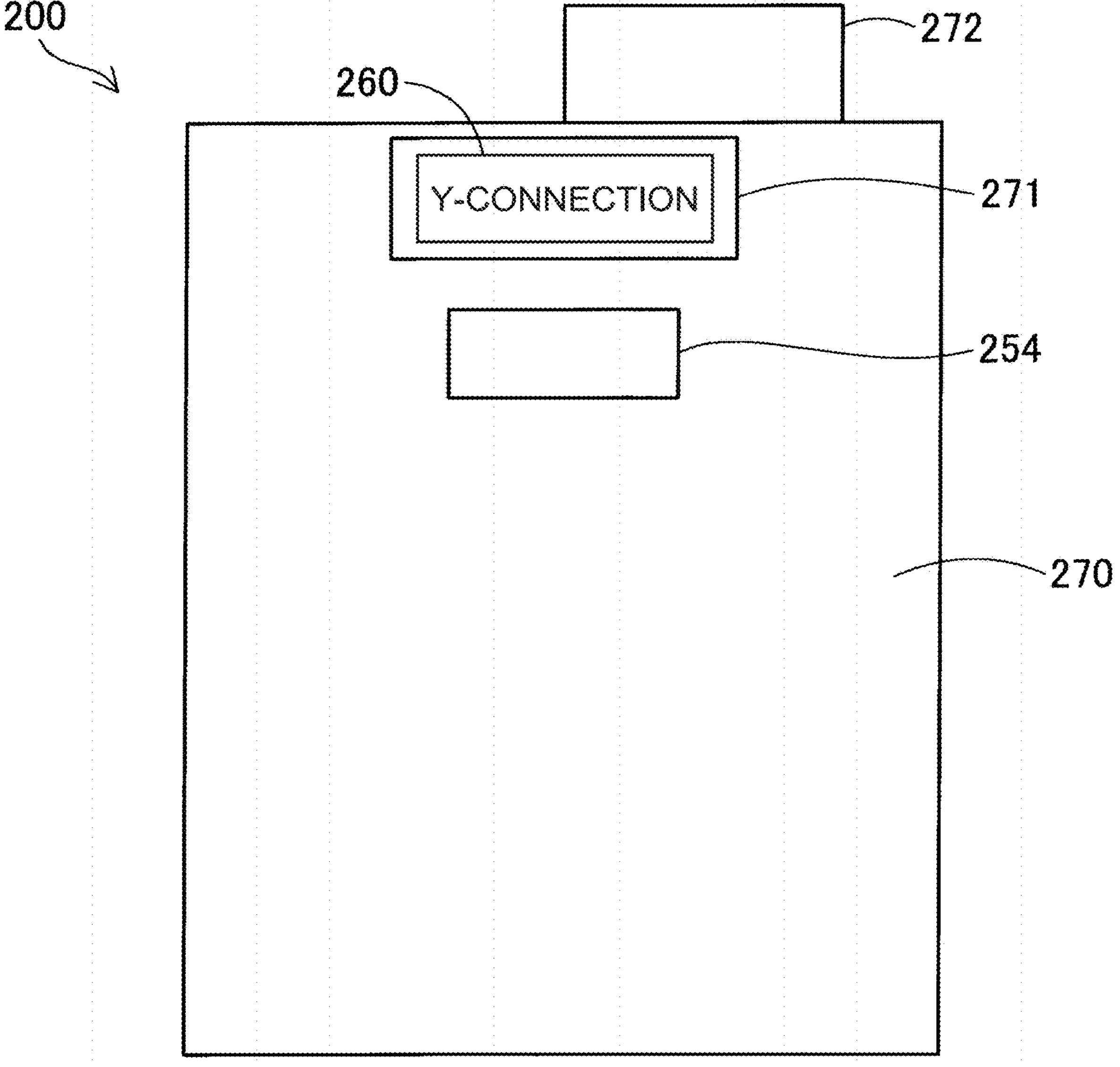
FIG. 3 is an external view of the first wiring unit.

FIG. 2 is a diagram showing an internal configuration of the first wiring unit 200. FIG. 3 is an external view of the first wiring unit 200. FIGS. 2 and 3 show the first wiring unit 200 as viewed from the front side. The first wiring unit 200 has a first input connection section 210, a first output connection section 220, a first wiring 240, a first control unit 250, a first display section 260, and a first housing 270. The first wiring 240 and the first display section 260 are covered by the first housing 270.

The first input connection section 210 is connected to the input section 110 of the electrical board 100. The first input connection section 210 has a first input connection terminal 211, a second input connection terminal 212, a third input connection terminal 213, a fourth input connection terminal 214, a fifth input connection terminal 215, a sixth input connection terminal 216, a seventh input connection terminal 217, and an eighth input connection terminal 218. The first input connection terminal 211 is connected to the second input connection terminal 212, the third input connection terminal 213 is connected to the fourth input connection terminal 214, the fifth input connection terminal 215 is connected to the sixth input connection terminal 216, and the seventh input connection terminal 217 is connected to the eighth input connection terminal 218. In this embodiment, the first input connection terminal 211, the third input connection terminal 213, the fifth input connection terminal 215, and the seventh input connection terminal 217 are male type terminals provided on the rear surface side of the first wiring unit 200. In the following, when each input connection terminal is referred to without distinction, it is simply referred to as an input connection terminal.

The first output connection section 220 is connected to the output section 120 of the electrical board 100. The first output connection section 220 has a first output connection terminal 221, a second output connection terminal 222, a third output connection terminal 223, a fourth output connection terminal 224, a fifth output connection terminal 225, a sixth output connection terminal 226, a seventh output connection terminal 227, an eighth output connection terminal 228, a ninth output connection terminal 229, a tenth output connection terminal 230, an eleventh output connection terminal 231, and a twelfth output connection terminal 232. The first output connection terminal 221 is connected to the second output connection terminal 222, the third output connection terminal 223 is connected to the fourth output connection terminal 224, the fifth output connection terminal 225 is connected to the sixth output connection terminal 226, the seventh output connection terminal 227 is connected to the eighth output connection terminal 228, the ninth output connection terminal 229 is connected to the tenth output connection terminal 230, the eleventh output connection terminal 231 is connected to the twelfth output connection terminal 232. In this embodiment, the second output connection terminal 222, the fourth output connection terminal 224, the sixth output connection terminal 226, the eighth output connection terminal 228, the tenth output connection terminal 230, and the twelfth output connection terminal 232 are male type terminals provided on the rear surface side of the first wiring unit 200. In the following, when each output connection terminal is referred to without distinction, it is simply referred to as an output connection terminal.

The first wiring unit 200 is mounted on the electrical board 100 so that the first input connection terminal 211 is connected to the first input terminal 111, the third input connection terminal 213 to the second input terminal 112, the fifth input connection terminal 215 to the third input terminal 113, the seventh input connection terminal 217 to the fourth input terminal 114, the second output connection terminal 222 to the first output terminal 121, the fourth output connection terminal 224 to the second output terminal 122, the sixth output connection terminal 226 to the third output terminal 123, the eighth output connection terminal 228 to the fourth output terminal 124, the tenth output connection terminal 230 to the fifth output terminal 125, and the twelfth output connection terminal 232 to the sixth output terminal 126.

When the first wiring unit 200 is mounted on the electrical board 100, the first wiring 240 connects the first input connection section 210 and the first output connection section 220 such that Y-connection three-phase AC input to the input section 110 is output as single-phase AC from the output section 120. In this embodiment, the first wiring 240 is constituted by a plurality of bus-bars. The bus-bars are preferably made of copper, brass, aluminum, or the like. The first wiring 240 has a first bus-bar 241, a second bus-bar 242, a third bus-bar 243, and a fourth bus-bar 244. The first bus-bar 241 connects the second input connection terminal 212 and the first output connection terminal 221. The second bus-bar 242 connects the fourth input connection terminal 214 and the fifth output connection terminal 225. The third bus-bar 243 connects the sixth input connection terminal 216 and the ninth output connection terminal 229. The fourth bus-bar 244 connects the eighth input connection terminal 218, the third output connection terminal 223, the seventh output connection terminal 227, and the eleventh output connection terminal 231. The input connection terminals and the output connection terminals to which the bus-bars connect are not limited to the terminals described above. Each bus-bar, when the first wiring unit 200 is mounted on the electrical board 100, just needs to connect the input connection terminal and the output connection terminal so that the Y-connection three-phase AC input to the input section 110 is output as single-phase AC from the output section 120.

The first control unit 250 has a first detection section 251, a first control section 252, a first breaker 253, and a first notification section 254. The first control unit 250 is driven by power that is supplied from a battery (not shown). Hereinafter, the first control unit 250 is also referred to as a control unit, the first detection section 251 is referred to as a detection section, the first control section 252 is referred to as a control section, the first breaker 253 is referred to as a breaker, and the first notification section 254 is referred to as a notification section.

The first detection section 251 measures voltage of single-phase AC output from the output section 120 by measuring voltage between the output connection terminals. In this embodiment, the first detection section 251 measures the voltage between the first output connection terminal 221 and the third output connection terminal 223. Note that the first detection section 251 may measure a voltage between the fifth output connection terminal 225 and the seventh output connection terminal 227, or may measure a voltage between the ninth output connection terminal 229 and the eleventh output connection terminal 231.

The first control section 252, when the voltage measured by the first detection section 251 exceeds a predetermined range of voltage, transmits a signal to the first breaker 253 and the first notification section 254. The first control section 252 is, for example, a microcomputer. Note that the first control section 252 may be configured by circuits. For example, when the voltage measured by the first detection section 251 is equal to or less than 180 V or is equal to or greater than 260 V, the first control section 252 transmits to the first breaker 253 a signal that instructs to disconnect the first input connection section 210 from the first output connection section 220. For example, when the voltage measured by the first detection section 251 is equal to or less than 180 V or is equal to or greater than 260 V, the first control section 252 transmits a signal that instructs to notify a warning to the first notification section 254.

Based on the voltage measured by the first detection section 251, the first control section 252 identifies whether the three-phase AC being input to the input section 110 is Y-connection or delta connection, and transmits to the first notification section 254 a signal that instructs to notify information for identifying whether it is Y-connection or delta connection. When the voltage measured by the first detection section 251 is within a first range, which is a predetermined range of voltage, the first control section 252 determines that the three-phase AC being input to the input section 110 is Y-connection. In this case, the first control section 252 transmits to the first notification section 254 a signal instructing to notify that the three-phase AC being input to the input section 110 is Y-connection. When the voltage measured by the first detection section 251 is within a second range, which is a predetermined range of voltage that is different from the first range, the first control section 252 determines that the three-phase AC being input to the input section 110 is delta connection. In this case, the first control section 252 transmits to the first notification section 254 a signal instructing to notify that the three-phase AC being input to the input section 110 is delta connection. The first range and the second range are determined based on the voltage of three-phase AC input to the input section 110.

The first breaker 253 is provided between the first input connection section 210 and the first wiring 240. Specifically, the first breaker 253 is located between the second input connection terminal 212 and the first bus-bar 241, between the fourth input connection terminal 214 and the second bus-bar 242, between the sixth input connection terminal 216 and the third bus-bar 243, and between the eighth input connection terminal 218 and the fourth bus-bar 244. The first breaker 253 disconnects a connection between the first input connection section 210 and the first output connection section 220 based on the voltage measured by the first detection section 251. In other words, the first breaker 253, based on the voltage measured by the first detection section 251, disconnects the connection between the input section 110 and the output section 120 of the electrical board 100. For example, when the voltage measured by the first detection section 251 is equal to or less than 180 V or equal to or greater than 260 V, the first breaker 253 disconnects the first input connection section 210 and the first output connection section 220 based on the signal transmitted from the first control section 252.

As shown in FIG. 3, the first notification section 254 is provided on the outer surface of the first housing 270. The first notification section 254 is, for example, a display. The first notification section 254 may be provided inside the first housing 270 so as to be visually checkable from outside of the first housing 270. The first notification section 254 may be a light.

The first notification section 254 notifies a warning when the voltage measured by the first detection section 251 exceeds a predetermined range of voltage. For example, when the voltage measured by the first detection section 251 is equal to or less than 180 V or equal to or greater than 260 V, the first notification section 254 displays a message "abnormal voltage" based on the signal transmitted from the first control section 252. If the first notification section 254 is a light, the light may be turned on in the above-described case.

The first notification section 254, based on the voltage measured by the first detection section 251, notifies information to identify whether the three-phase AC being input to the input section 110 is Y-connection or delta connection. When the voltage measured by the first detection section 251 is within the first range, the first notification section 254 displays a message "Y-connection" based on the signal transmitted from the first control section 252. When the voltage measured by the first detection section 251 is within the second range, the first notification section 254 displays a message "A connection" based on the signal transmitted from the first control section 252.

The first display section 260 is indicating that it is Y-connection. "Y-connection" is indicated in the first display section 260. The first display section 260 is provided inside the first housing 270.

The first housing 270 has a first window section 271 and a first board section 272.

The first window section 271 is a window provided in the first housing 270. The first window section 271 is provided in the first housing 270 so that the first display section 260 can be visually checkable from outside of the first housing 270.

The first board section 272 is a plate-like member that is provided in the upper portion of the first housing 270. The first board section 272 is provided in the first wiring unit 200 so that when the first wiring unit 200 is mounted on the electrical board 100, it covers the delta connection display section 140 of the electrical board 100 and exposes the Y-connection display section 130.

Figure 4:
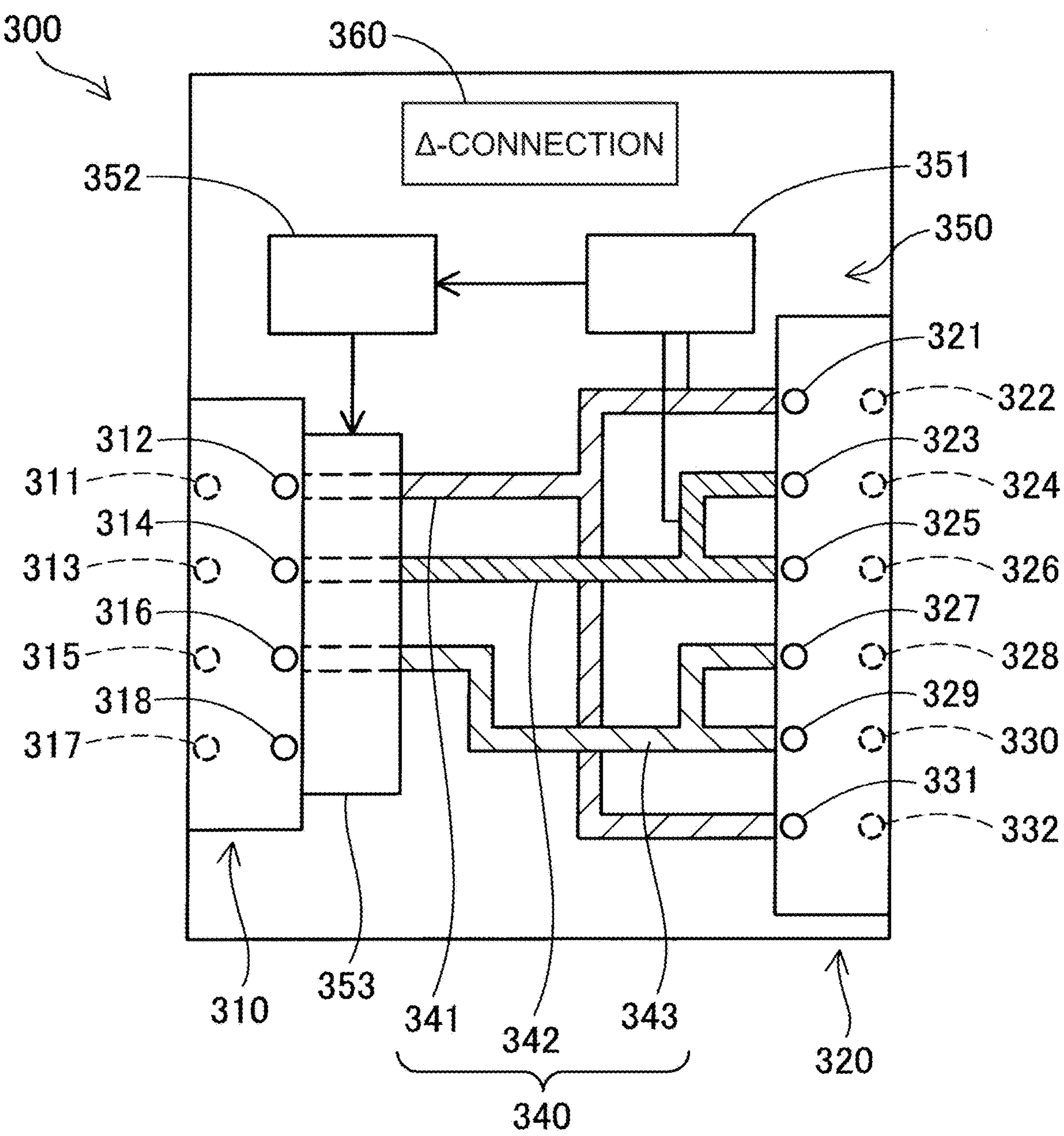
FIG. 4 is a diagram showing an internal configuration of a second wiring unit.
Figure 5:
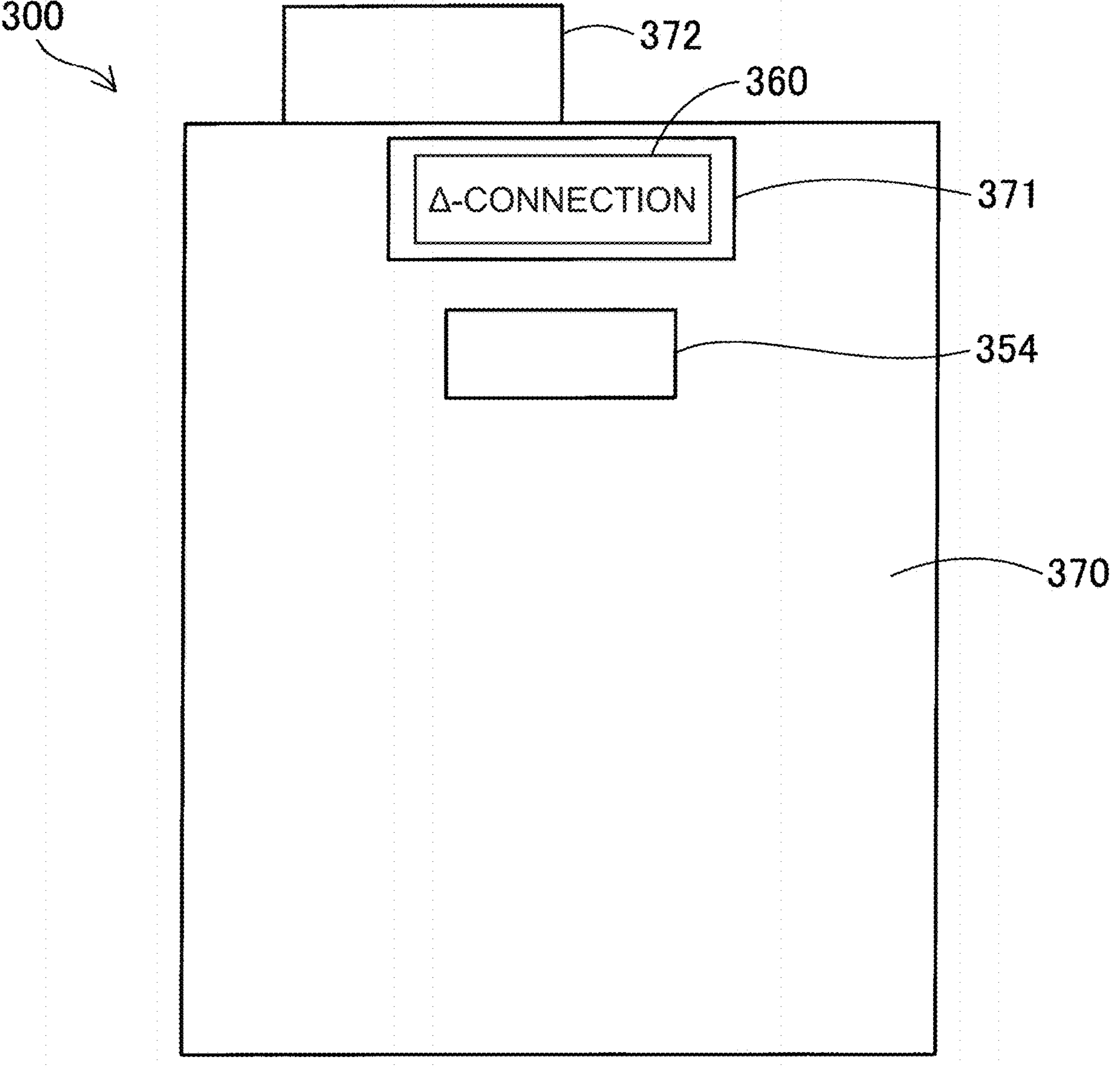
FIG. 5 is an external view of the second wiring unit.

FIG. 4 is a diagram showing an internal configuration of the second wiring unit 300. FIG. 5 is an external view of the second wiring unit 300. FIGS. 4 and 5 show the second wiring unit 300 as viewed from the front side. The second wiring unit 300 has a second input connection section 310, a second output connection section 320, a second wiring 340, a second control unit 350, a second display section 360, and a second housing 370. The second wiring 340 and the second display section 360 are covered by the second housing 370. Hereinafter, when the first wiring unit 200 and the second wiring unit 300 are referred to without distinction, they are simply referred to as a wiring unit.

The second input connection section 310 is connected to the input section 110 of the electrical board 100. The second input connection section 310 has an eleventh input connection terminal 311, a twelfth input connection terminal 312, a thirteenth input connection terminal 313, a fourteenth input connection terminal 314, a fifteenth input connection terminal 315, a sixteenth input connection terminal 316, a seventeenth input connection terminal 317, and an eighteenth input connection terminal 318. The eleventh input connection terminal 311 is connected to the twelfth input connection terminal 312, the thirteenth input connection terminal 313 is connected to the fourteenth input connection terminal 314, the fifteenth input connection terminal 315 is connected to the sixteenth input connection terminal 316, and the seventeenth input connection terminal 317 is connected to the eighteenth input connection terminal 318. In this embodiment, the eleventh input connection terminal 311, the thirteenth input connection terminal 313, the fifteenth input connection terminal 315, and the seventeenth input connection terminal 317 are male type terminals provided on the rear surface side of the second wiring unit 300.

The second output connection section 320 is connected to the output section 120 of the electrical board 100. The second output connection section 320 has a twenty-first output connection terminal 321, a twenty-second output connection terminal 322, a twenty-third output connection terminal 323, a twenty-fourth output connection terminal 324, a twenty-fifth output connection terminal 325, a twenty-sixth output connection terminal 326, a twenty-seventh output connection terminal 327, a twenty-eighth output connection terminal 328, a twenty-ninth output connection terminal 329, a thirtieth output connection terminal 330, a thirty-first output connection terminal 331, and a thirty-second output connection terminal 332. The twenty-first output connection terminal 321 is connected to the twenty-second output connection terminal 322, the twenty-third output connection terminal 323 is connected to the twenty-fourth output connection terminal 324, the twenty-fifth output connection terminal 325 is connected to the twenty-sixth output connection terminal 326, the twenty-seventh output connection terminal 327 is connected to the twenty-eighth output connection terminal 328, the twenty-ninth output connection terminal 329 is connected to the thirtieth output connection terminal 330, and the thirty-first output connection terminal 331 is connected to the thirty-second output connection terminal 332. In this embodiment, the twenty-second output connection terminal 322, the twenty-fourth output connection terminal 324, the twenty-sixth output connection terminal 326, the twenty-eighth output connection terminal 328, the thirtieth output connection terminal 330, and the thirty-second output connection terminal 332 are male type terminals provided on the rear surface side of the second wiring unit 300.

The second wiring unit 300 is mounted on the electrical board 100 such that the eleventh input connection terminal 311 is connected to the first input terminal 111, the thirteenth input connection terminal 313 to the second input terminal 112, the fifteenth input connection terminal 315 to the third input terminal 113, the seventeenth input connection terminal 317 to the fourth input terminal 114, the twenty-second output connection terminal 322 to the first output terminal 121, the twenty-fourth output connection terminal 324 to the second output terminal 122, the twenty-sixth output connection terminal 326 to the third output terminal 123, the twenty-eighth output connection terminal 328 to the fourth output terminal 124, the thirtieth output connection terminal 330 to the fifth output terminal 125, and the thirty-second output connection terminal 332 to the sixth output terminal 126.

When the second wiring unit 300 is mounted on the electrical board 100, the second wiring 340 connects the second input connection section 310 and the second output connection section 320 so that delta connection three-phase AC input to the input section 110 is output as single-phase AC from the output section 120. In this embodiment, the second wiring 340 is constituted by a plurality of bus-bars. The bus-bars are preferably made of copper, brass, aluminum, or the like. The second wiring 340 has a fifth bus-bar 341, a sixth bus-bar 342, and a seventh bus-bar 343. The fifth bus-bar 341 connects the twelfth input connection terminal 312, the twenty-first output connection terminal 321, and the thirty-first output connection terminal 331. The sixth bus-bar 342 connects the fourteenth input connection terminal 314, the twenty-third output connection terminal 323, and the twenty-fifth output connection terminal 325. The seventh bus-bar 343 connects the sixteenth input connection terminal 316, the twenty-seventh output connection terminal 327, and the twenty-ninth output connection terminal 329. The input connection terminals and the output connection terminals to which the bus-bars connect are not limited to the terminals described above. When the second wiring unit 300 is mounted on the electrical board 100, each bus-bar connects the input connection terminals and the output connection terminals so that delta connection three-phase AC input to the input section 110 is output as single-phase AC from the output section 120.

The second control unit 350 has a second detection section 351, a second control section 352, a second breaker 353, and a second notification section 354. The second control unit 350 is driven by power supplied from a battery (not shown). Hereinafter, the second control unit 350 is also referred to as a control unit, the second detection section 351 as a detection section, the second control section 352 as a control section, the second breaker 353 as a breaker, and the second notification section 354 as a notification section.

The second detection section 351 measures voltage of single-phase AC output from the output section 120 by measuring voltage between the output connection terminals. In this embodiment, the second detection section 351 measures a voltage between the twenty-first output connection terminal 321 and the twenty-third output connection terminal 323. Note that the second detection section 351 may measure a voltage between the twenty-fifth output connection terminal 325 and the twenty-seventh output connection terminal 327, or may measure a voltage between the twenty-ninth output connection terminal 329 and the thirty-first output connection terminal 331.

When the voltage measured by the second detection section 351 exceeds a predetermined range of voltage, the second control section 352 transmits a signal to the second breaker 353 and the second notification section 354. The second control section 352 is, for example, a microcomputer. Note that the second control section 352 may be configured by circuits. For example, when the voltage measured by the second detection section 351 is equal to or less than 180 V or equal to or greater than 260 V, the second control section 352 transmits to the second breaker 353 a signal that instructs to disconnect the connection between the second input connection section 310 and the second output connection section 320. For example, when the voltage measured by the second detection section 351 is equal to or less than 180 V or equal to or greater than 260 V, the second control section 352 transmits to the second notification section 354 a signal that instructs to notify a warning.

The second control section 352, based on the voltage measured by the second detection section 351, identifies whether the three-phase AC being input to the input section 110 is Y-connection or delta connection, and transmits a signal to the second notification section 354 that instructs to notify information for identifying Y-connection or delta connection. The second control section 352 determines that the three-phase AC being input to the input section 110 is Y-connection when the voltage measured by the second detection section 351 is within a third range, which is a predetermined range of voltage. In this case, the second control section 352 transmits to the second notification section 354 a signal that instructs to notify that the three-phase AC being input to the input section 110 is Y-connection. When the voltage measured by the second detection section 351 is within a fourth range, which is a predetermined range of voltage different from the third range, the second control section 352 determines that the three-phase AC being input to the input section 110 is delta connection. In this case, the second control section 352 transmits to the second notification section 354 a signal that instructs to notify that the three-phase AC being input to the input section 110 is delta connection. The third range and the fourth range are determined based on the voltage of three-phase AC input to the input section 110.

The second breaker 353 is provided between the second input connection section 310 and the second wiring 340. Specifically, the second breaker 353 is provided between the twelfth input connection terminal 312 and the fifth bus-bar 341, between the fourteenth input connection terminal 314 and the sixth bus-bar 342, and between the sixteenth input connection terminal 316 and the seventh bus-bar 343. The second breaker 353 disconnects the connection between the second input connection section 310 and the second output connection section 320 based on the voltage measured by the second detection section 351. In other words, the second breaker 353, based on the voltage measured by the second detection section 351, disconnects the connection between the input section 110 and the output section 120 of the electrical board 100. For example, when the voltage measured by the second detection section 351 is equal to or less than 180 V or equal to or greater than 260 V, the second breaker 353 disconnects the connection between the second input connection section 310 and the second output connection section 320 based on a signal transmitted from the second control section 352.

As shown in FIG. 5, the second notification section 354 is provided on the outer surface of the second housing 370. The second notification section 354 is, for example, a display. The second notification section 354 may be provided inside the second housing 370 so as to be visually checkable from the outside of the second housing 370. The second notification section 354 may be a light.

The second notification section 354 notifies a warning when the voltage measured by the second detection section 351 exceeds a predetermined range of voltage. For example, when the voltage measured by the second detection section 351 is equal to or less than 180 V or equal to or greater than 260 V, the second notification section 354 displays a message "abnormal voltage" based on the signal transmitted from the second control section 352. If the second notification section 354 is a light, the light may be turned on in the above-described case.

The second notification section 354, based on the voltage measured by the second detection section 351, notifies information to identify whether the three-phase AC being input to the input section 110 is Y-connection or delta connection. When the voltage measured by the second detection section 351 is within the third range, the second notification section 354 displays a message "Y-connection" based on the signal transmitted from the second control section 352. When the voltage measured by the second detection section 351 is within the fourth range, the second notification section 354 displays a message "A connection" based on the signal transmitted from the second control section 352.

The second display section 360 displays an indication that it is delta connection. The "A connection" is indicated in the second display section 360. The second display section 360 is provided inside the second housing 370.

The second housing 370 has a second window section 371 and a second board section 372.

The second window section 371 is a window provided in the second housing 370. The second window section 371 is provided in the second housing 370 so that the second display section 360 can be visually checkable from the outside of the second housing 370.

The second board section 372 is a plate-like member provided in the upper portion of the second housing 370. The second board section 372 is provided on the second wiring unit 300 so as to cover the Y-connection display section 130 of the electrical board 100 and to expose the delta connection display section 140 when the second wiring unit 300 is mounted on the electrical board 100.

According to the three-phase power supply switching unit 10 of the first embodiment described above, Y-connection three-phase AC input to the input section 110 can be converted into single-phase AC and can be output from the output section 120 by mounting the first wiring unit 200 on the electrical board 100, and delta connection three-phase AC input to the input section 110 can be converted into single-phase AC and can be output from the output section 120 by mounting the second wiring unit 300 on the electrical board 100. Therefore, by using a simple circuit, it is possible to switch between a state in which Y-connection three-phase AC is converted into single-phase AC and a state in which delta connection three-phase AC is converted into single-phase AC.

In this embodiment, the voltage of single-phase AC output from the output section 120 is measured by the detection section, and when the voltage detected by the detection section exceeds the predetermined range of voltage, the breaker disconnects the connection between the input section 110 and the output section 120 of the electrical board 100. Therefore, if the single-phase AC with an abnormal voltage value is output from the output section 120, it is possible to suppress failures of devices connected to the output section 120.

In this embodiment, the detection section measures the voltage of single-phase AC output from the output section 120, and when the voltage measured by the detection section exceeds a predetermined range of voltage, the notification section notifies a warning. Therefore, the user can easily recognize that a single-phase AC with an abnormal voltage value is being output from the output section 120.

In this embodiment, the detection section measures the voltage of single-phase AC output from the output section 120, and the notification section notifies the information for identifying whether the three-phase AC being input to the input section 110 is Y-connection or delta connection based on the voltage measured by the detection section. Therefore, the user can easily recognize whether the three-phase AC being input to the input section 110 is Y-connection or delta connection. By this, the user can easily recognize whether or not a wiring unit corresponding to the three-phase AC being input to the input section 110 is mounted in the electrical board 100.

In this embodiment, the first display section 260, which displays an indication that it is Y-connection, is provided inside the first housing 270, and the first housing 270 is provided with the first window section 271 through which the first display section 260 can be visually checked from outside of the first housing 270. Therefore, unlike the case where the first display section 260 is provided on the outer surface of the first housing 270, the user can easily recognize that the wiring unit is the first wiring unit 200 even when the coating on the outer surface of the first housing 270 has peeled off. Similarly, unlike the case where the second display section 360 is provided on the outer surface of the second housing 370, even when the coating of the outer surface of the second housing 370 has peeled off, the user can easily recognize that the wiring unit is the second wiring unit 300.

In this embodiment, in a state where the first wiring unit 200 is mounted on the electrical board 100, the delta connection display section 140 is covered by the first board section 272, and the Y-connection display section 130 is exposed. In a state where the second wiring unit 300 is mounted on the electrical board 100, the Y-connection display section 130 is covered by the second board section 372, and the delta connection display section 140 is exposed. Therefore, the user can easily recognize which wiring unit is mounted on the electrical board 100.

B. Second Embodiment

In a second embodiment, the configuration of the second wiring unit 300 is different from that of the first embodiment. The configurations of the electrical board 100 and the first wiring unit 200 are the same as those in the first embodiment.

Figure 6:
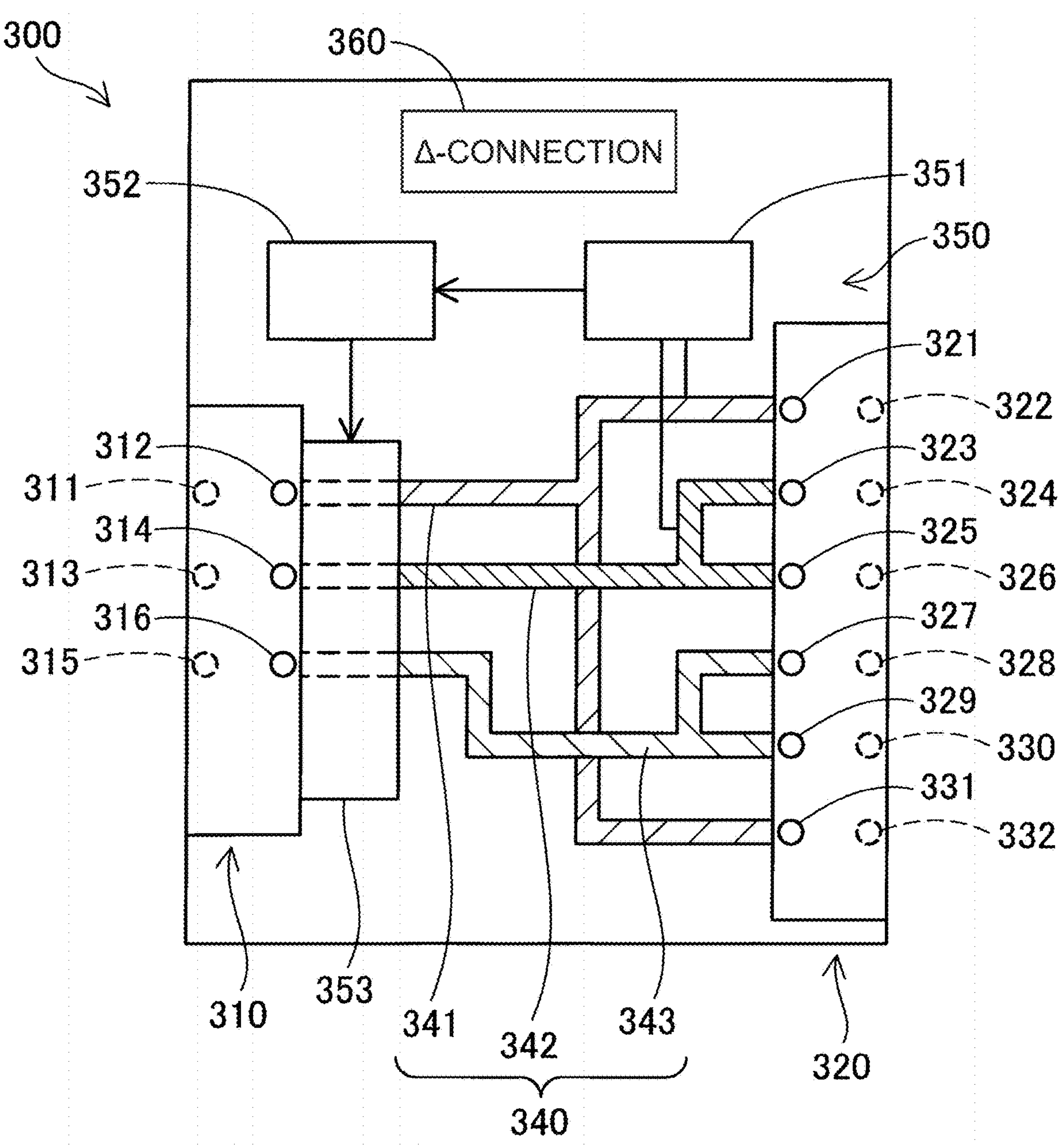
FIG. 6 is a diagram showing an internal configuration of the second wiring unit in a second embodiment.

FIG. 6 is a diagram showing an internal configuration of the second wiring unit 300 in the second embodiment. In the second embodiment, the second input connection section 310 of the second wiring unit 300 does not include the seventeenth input connection terminal 317 and the eighteenth input connection terminal 318. In other words, the number of input connection terminals included in the first input connection section 210 of the first wiring unit 200 is different from the number of input connection terminals included in the second input connection section 310 of the second wiring unit 300.

According to the three-phase power supply switching unit 10 of the second embodiment described above, since the number of input connection terminals is different between the first wiring unit 200 and the second wiring unit 300, the user can easily identify the first wiring unit 200 and the second wiring unit 300. Therefore, it is possible to suppress that the user mistakenly mount the second wiring unit 300 on the electrical board 100 when Y-connection three-phase AC is input to the input section 110 of the electrical board 100, and to suppress that the user mistakenly mount the first wiring unit 200 on the electrical board 100 when delta connection three-phase AC is input to the input section 110 of the electrical board 100.

C. Third Embodiment

In a third embodiment, the three-phase power supply switching unit 10 further includes a second electrical board 101. Current capacity of the second electrical board 101 is larger than current capacity of the electrical board 100. In this embodiment, the electrical board 100, the first wiring unit 200, and the second wiring unit 300 have the same current capacity.

Figure 7:
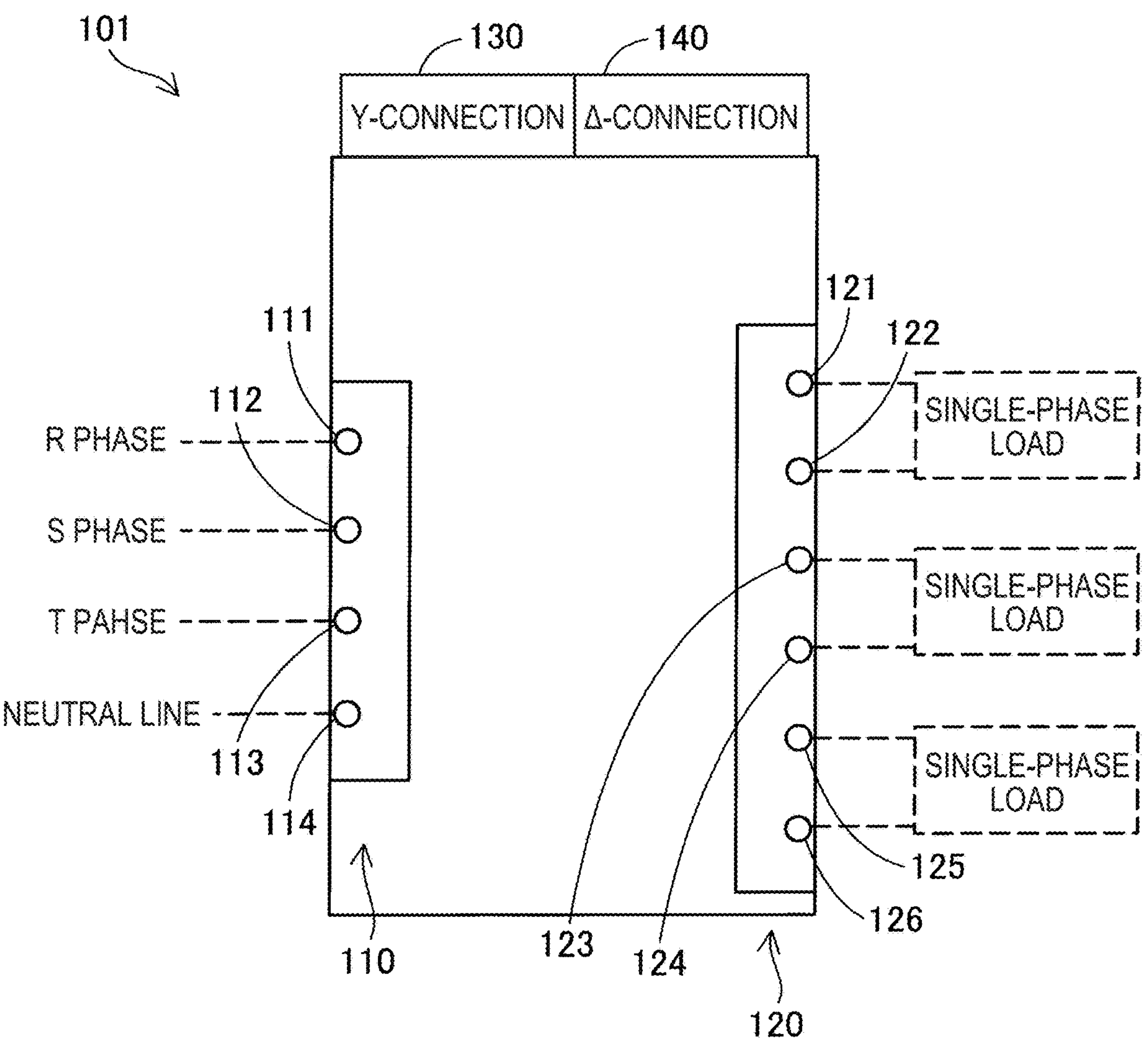
FIG. 7 is a diagram showing a schematic configuration of a second electrical board.

FIG. 7 is a diagram showing a schematic configuration of the second electrical board 101. The configuration of the second electrical board 101 is the same as that of the electrical board 100. In the second electrical board 101, the distance between the input terminals is larger than the distance between the input terminals of the electrical board 100, and the distance between the output terminals is larger than the distance between the output terminals of the electrical board 100. Either a third wiring unit 201 or a fourth wiring unit 301 is mounted on the second electrical board 101.

Figure 8:
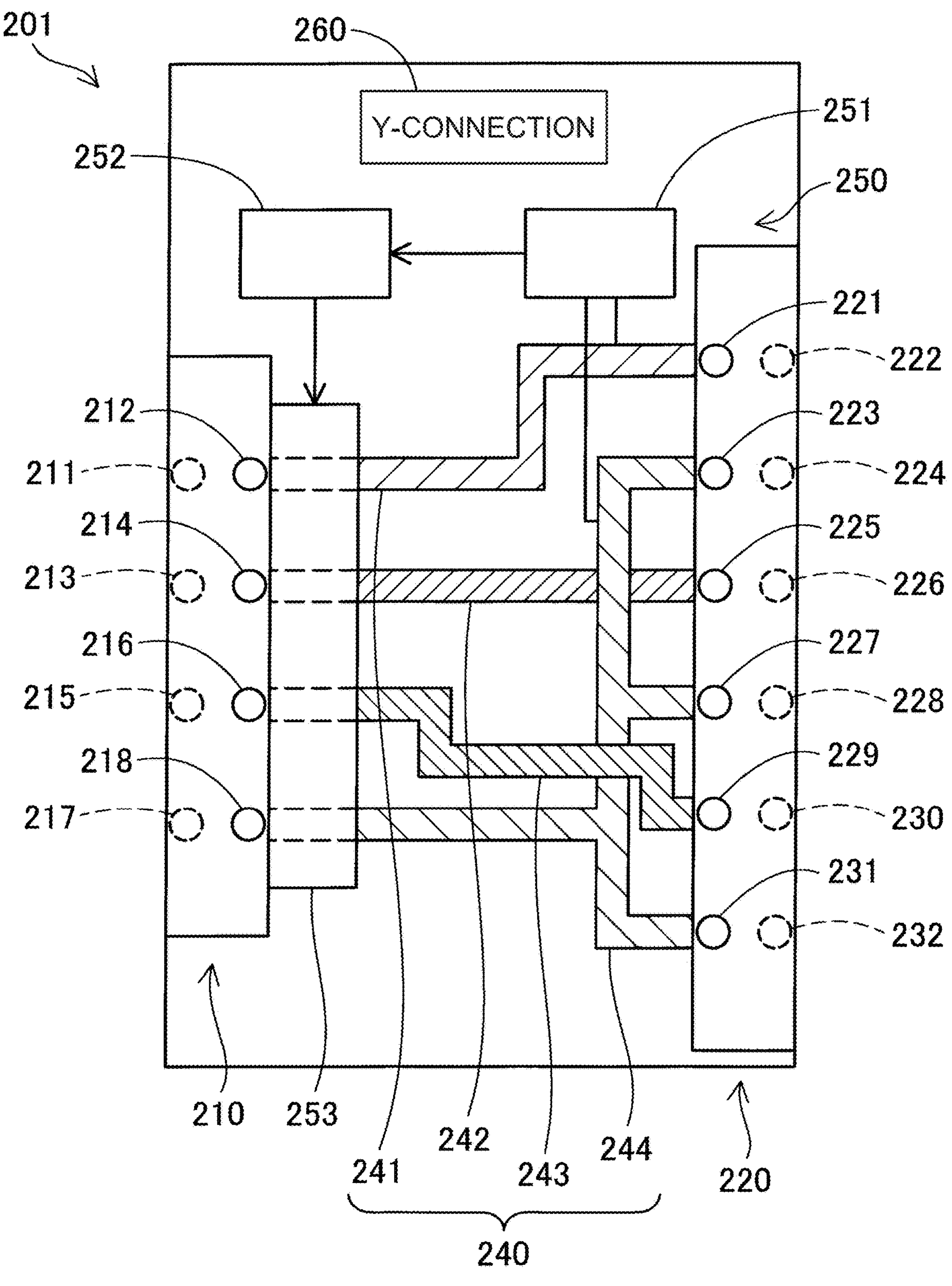
FIG. 8 is a diagram showing an internal configuration of a third wiring unit.

FIG. 8 is a diagram showing an internal configuration of the third wiring unit 201. The configuration of the third wiring unit 201 is the same as that of the first wiring unit 200. Current capacity of the third wiring unit 201 is larger than current capacity of the first wiring unit 200. In the third wiring unit 201, the distance between the input connection terminals is larger than the distance between the input connection terminals of the first wiring unit 200, and the distance between the output connection terminals is larger than the distance between the output connection terminals of the first wiring unit 200. The distance between the input connection terminals of the third wiring unit 201 is equal to the distance between the input terminals of the second electrical board 101, and the distance between the output connection terminals of the third wiring unit 201 is equal to the distance between the output terminals of the second electrical board 101. The bus-bars provided on the third wiring unit 201 are thicker than the bus-bars provided on the first wiring unit 200.

Figure 9:
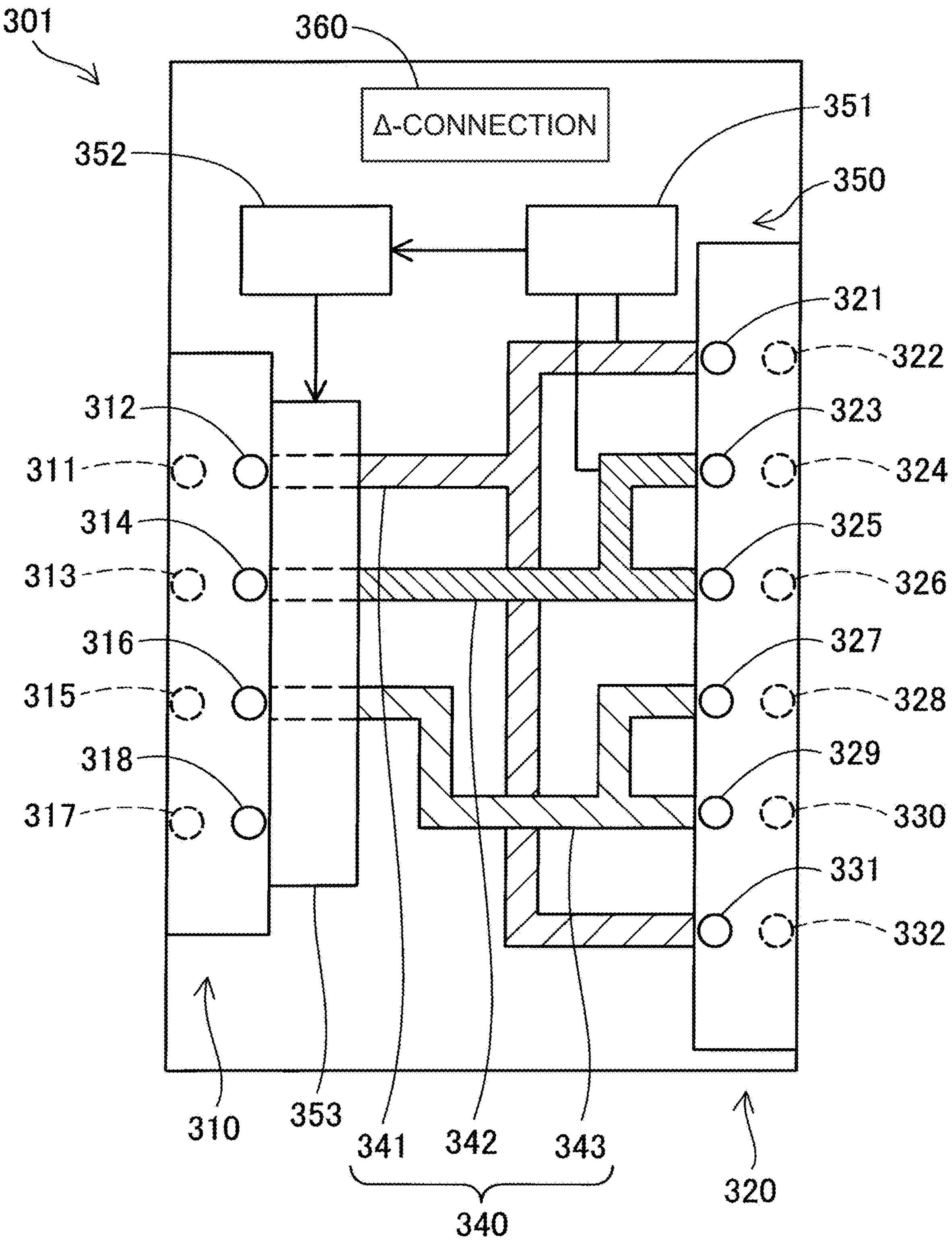
FIG. 9 is a diagram showing an internal configuration of a fourth wiring unit.

FIG. 9 is a diagram showing an internal configuration of the fourth wiring unit 301. The configuration of the fourth wiring unit 301 is the same as that of the second wiring unit 300. Current capacity of the fourth wiring unit 301 is larger than current capacity of the second wiring unit 300. In the fourth wiring unit 301, the distance between the input connection terminals is larger than the distance between the input connection terminals of the second wiring unit 300, and the distance between the output connection terminals is larger than the distance between the output connection terminals of the second wiring unit 300. The distance between each input connection terminal of the fourth wiring unit 301 is equal to the distance between each input terminal of the second electrical board 101, and the distance between each output connection terminal of the fourth wiring unit 301 is equal to the distance between each output terminal of the second electrical board 101. The bus-bars provided in the fourth wiring unit 301 are thicker than the bus-bars provided in the second wiring unit 300.

According to the third embodiment described above, the distance between the input terminals of the electrical board 100 is different from the distance between the input connection terminals of the third wiring unit 201 and the fourth wiring unit 301, and the distance between the output terminals of the electrical board 100 is different from the distance between the output connection terminals of the third wiring unit 201 and the fourth wiring unit 301. The distance between the input terminals of the second electrical board 101 is different from the distance between the input connection terminals of the first wiring unit 200 and the second wiring unit 300, and the distance between the output terminals of the second electrical board 101 is different from the distance between the output connection terminals of the first wiring unit 200 and the second wiring unit 300. Therefore, it is impossible to mount the third wiring unit 201 or the fourth wiring unit 301 to the electrical board 100, and to mount the first wiring unit 200 or the second wiring unit 300 to the second electrical board 101. Therefore, it is possible to suppress a wiring unit that has a different current capacity from being mounted on the electrical board 100 and the second electrical board 101.

Other Embodiments (D-1) In the above embodiments, the first wiring 240 and the second wiring 340 are configured by a plurality of bus-bars. However, the first wiring 240 and the second wiring 340 may be configured by a plurality of cables.

(D-2) In the above embodiments, the output section 120 of the electrical board 100 outputs three sets of single-phase AC. However, the output section 120 may output four or more sets of single-phase AC. For example, the output section 120 may output a plurality of sets of single-phase AC from the first output terminal 121 and the second output terminal 122 by branching one set of single-phase AC being output from the first output terminal 121 and the second output terminal 122. The same applies to single-phase AC being output from the third output terminal 123 and the fourth output terminal 124, and to single-phase AC being output from the fifth output terminal 125 and the sixth output terminal 126.

(D-3) In the above embodiments, the input connection terminals that are connected to the input terminals and the output connection terminals that are connected to the output terminals are male type terminals provided on the back surface side of the wiring unit. However, the input connection terminals and the output connection terminals may be terminals of a screw-type terminal block or terminals of an insertion-type terminal block. In this case, the input terminals and the input connection terminals, and the output terminals and the output connection terminals are connected by cables or the like.

(D-4) In the above embodiments, the first wiring unit 200 and the second wiring unit 300 each include a control unit. However, only one of the first wiring unit 200 and the second wiring unit 300 may include a control unit, or it may be that neither of the first wiring unit 200 and the second wiring unit 300 include a control unit.

(D-5) In the above embodiments, the first wiring unit 200 includes the first display section 260. However, the first wiring unit 200 may not include the first display section 260. In this case, the first housing 270 may not be provided with the first window section 271.

(D-6) In the above embodiments, the second wiring unit 300 includes the second display section 360. However, the second wiring unit 300 may not include the second display section 360. In this case, the second housing 370 may not be provided with the second window section 371.

(D-7) In the above embodiments, the electrical board 100 includes the Y-connection display section 130 and the delta connection display section 140. However, the electrical board 100 may not include the Y-connection display section 130 and the delta connection display section 140.

E. Other Aspects

The present disclosure is not limited to the above-described embodiments, and can be realized in various forms without departing from the spirit thereof. For example, the present disclosure can also be realized by the following aspects. The technical features in the above-described embodiments corresponding to the technical features in each aspect described below can be appropriately replaced or combined in order to solve a part or all of the problems of the present disclosure or in order to achieve a part or all of the effects of the present disclosure. If the technical features are not described as essential in this specification, the technical features can be appropriately omitted.

(1) According to one aspect of the present disclosure, a three-phase power supply switching unit is provided. This three-phase power supply switching unit includes an electrical board on which either a first wiring unit or a second wiring unit is mounted, wherein the electrical board has an input section to which the three-phase alternating current with Y-connection or delta connection is input, and an output section that outputs single-phase alternating current, the first wiring unit has a first input connection section that is connected to the input section, a first output connection section that is connected to the output section, and a first wiring that connects the first input connection section and the first output connection section so that Y-connection three-phase alternating current that was input to the input section is output as single-phase alternating current from the output section when the first wiring unit is mounted on the electrical board, the second wiring unit has a second input connection section that is connected to the input section, a second output connection section that is connected to the output section, and a second wiring that connects the second input connection section and the second output connection section so that delta connection three-phase alternating current that was input to the input section is output as single-phase alternating current from the output section when the second wiring unit is mounted on the electrical board.

According to such an aspect, by using a simple circuit, it is possible to switch between a state in which Y-connection three-phase AC is converted into single-phase AC and a state in which delta connection three-phase AC is converted into single-phase AC.

(2) The above aspect may be configured such that at least one of the first wiring unit and the second wiring unit has a control unit, and the control unit has a detection section that measures voltage of the single-phase alternating current that is output from the output section.

(3) The above aspects may be configured such that the control unit has a notification section that notifies a warning when the voltage measured by the detection section exceeds a predetermined range of voltage.

According to such an aspect, a user can easily recognize that single-phase AC with an abnormal voltage value is output from the output section.

(4) The above aspects may be configured such that the control unit has a notification section that notifies information that identifies whether the three-phase alternating current being input to the input section is Y-connection three-phase alternating current or delta connection three-phase alternating current, based on the voltage measured by the detection section.

According to such an aspect, the user can easily recognize whether the three-phase AC being input to the input section is Y-connection or delta connection.

(5) The above aspects may be configured such that the control unit has a breaker that disconnects a connection between the input section and the output section when the voltage measured by the detection section exceeds a predetermined voltage range.

According to such an aspect, it is possible to prevent devices connected to the output section from malfunctioning when single-phase AC with abnormal voltage value is output from the output section.

(6) The above aspects may be configured such that the first wiring unit has a first display section that indicates that it is Y-connection and a first housing that covers the first wiring and the first display section, the first housing has a first window section that is configured so that the first display section is visually checkable from outside of the first housing, the second wiring unit has a second display section that displays that it is delta connection and a second housing that covers the second wiring and the second display section, and the second housing has a second window section that is configured so that the second display section is visually checkable from outside the second housing.

According to such an aspect, even if the coating on the outer surfaces of the first housing and the second housing has peeled off, the user can easily identify the first wiring unit and the second wiring unit.

(7) The above aspects may be configured such that the electrical board has a Y-connection display section that displays that it is Y-connection and a delta connection display section that displays that it is delta connection, the first wiring unit has a first plate section that covers the delta connection display section and that exposes the Y-connection display section, when the first wiring unit is mounted on the electrical board, and the second wiring unit has a second plate section that covers the Y-connection display section and that exposes the delta connection display section, when the second wiring unit is mounted on the electrical board.

According to such an aspect, the user can easily recognize whether the first wiring unit is mounted on the electrical board or the second wiring unit is mounted on the electrical board.

(8) The above aspects may be configured such that the first input connection section and the second input connection section are each configured by a plurality of terminals and a number of terminals provided in the first input connection section is different from a number of terminals provided in the second input connection section.

According to such an aspect, the user can easily identify the first wiring unit 200 and the second wiring unit 300.

What is claimed is:

1. A three-phase power supply switching unit, comprising:

an electrical board on which either a first wiring unit or a second wiring unit is mounted, wherein the electrical board has an input section to which Y-connection three-phase alternating current or delta connection three-phase alternating current is input, and an output section that outputs single-phase alternating current, the first wiring unit has a first input connection section that is connected to the input section, a first output connection section that is connected to the output section, and a first wiring that connects the first input connection section and the first output connection section so that Y-connection three-phase alternating current that was input to the input section is output as single-phase alternating current from the output section when the first wiring unit is mounted on the electrical board, the second wiring unit has a second input connection section that is connected to the input section, a second output connection section that is connected to the output section, and a second wiring that connects the second input connection section and the second output connection section so that delta connection three-phase alternating current that was input to the input section is output as single-phase alternating current from the output section when the second wiring unit is mounted on the electrical board.

2. The three-phase power supply switching unit according to claim 1, wherein at least one of the first wiring unit and the second wiring unit has a control unit, and the control unit has a detection section that measures voltage of the single-phase alternating current that is output from the output section.

3. The three-phase power supply switching unit according to claim 2, wherein the control unit has a notification section that notifies a warning when the voltage measured by the detection section exceeds a predetermined range of voltage.

4. The three-phase power supply switching unit according to claim 2, wherein the control unit has a notification section that notifies information that identifies whether the three-phase alternating current being input to the input section is Y-connection three-phase alternating current or delta connection three-phase alternating current, based on the voltage measured by the detection section.

5. The three-phase power supply switching unit according to claim 2, wherein the control unit has a breaker that disconnects a connection between the input section and the output section when the voltage measured by the detection section exceeds a predetermined voltage range.

6. The three-phase power supply switching unit according to claim 1, wherein the first wiring unit has a first display section that indicates that it is Y-connection and a first housing that covers the first wiring and the first display section, the first housing has a first window section that is configured so that the first display section is visually checkable from outside of the first housing, the second wiring unit has a second display section that displays that it is delta connection and a second housing that covers the second wiring and the second display section, and the second housing has a second window section that is configured so that the second display section is visually checkable from outside the second housing.

7. The three-phase power supply switching unit according to claim 1, wherein the electrical board has a Y-connection display section that displays that it is Y-connection and a delta connection display section that displays that it is delta connection, the first wiring unit has a first plate section that covers the delta connection display section and that exposes the Y-connection display section, when the first wiring unit is mounted on the electrical board, and the second wiring unit has a second plate section that covers the Y-connection display section and that exposes the delta connection display section, when the second wiring unit is mounted on the electrical board.

8. The three-phase power supply switching unit according to claim 1, wherein the first input connection section and the second input connection section are each configured by a plurality of terminals and a number of terminals provided in the first input connection section is different from a number of terminals provided in the second input connection section.

* * * * *